United States Patent
Vanderberg

(10) Patent No.: US 8,138,484 B2
(45) Date of Patent: Mar. 20, 2012

(54) MAGNETIC SCANNING SYSTEM WITH IMPROVED EFFICIENCY

(75) Inventor: Bo Vanderberg, Gloucester, MA (US)

(73) Assignee: Axcelis Technologies Inc., Beverly, MA (US)

( * ) Notice: Subject to any disclaimer, the term of this patent is extended or adjusted under 35 U.S.C. 154(b) by 161 days.

(21) Appl. No.: 12/769,226

(22) Filed: Apr. 28, 2010

(65) Prior Publication Data

US 2011/0266456 A1    Nov. 3, 2011

(51) Int. Cl.
*H01J 1/50* (2006.01)

(52) U.S. Cl. ......... 250/396 ML; 250/396 R; 250/492.1; 250/492.3

(58) Field of Classification Search ............... 250/396 R, 250/396 ML, 492.1, 492.2, 492.3, 281, 282
See application file for complete search history.

(56) References Cited

U.S. PATENT DOCUMENTS

| | | | |
|---|---|---|---|
| 4,303,865 A * | 12/1981 | Swingler | 250/423 R |
| 5,834,786 A | 11/1998 | White et al. | |
| 6,207,963 B1 | 3/2001 | Benveniste | |
| 6,770,888 B1 | 8/2004 | Benveniste et al. | |
| 6,835,930 B2 | 12/2004 | Benveniste et al. | |
| 7,498,572 B2 | 3/2009 | Fujita | |
| 7,615,763 B2 | 11/2009 | Vanderberg et al. | |
| 2002/0109099 A1 | 8/2002 | White et al. | |
| 2008/0067436 A1 | 3/2008 | Vanderberg et al. | |
| 2009/0189096 A1 | 7/2009 | Chen et al. | |

FOREIGN PATENT DOCUMENTS

WO      93/17445      9/1993

* cited by examiner

*Primary Examiner* — Michael Maskell
(74) *Attorney, Agent, or Firm* — Eschweiler & Associates, LLC

(57) ABSTRACT

Some aspects of the present invention facilitate ion implantation by using a magnetic beam scanner that includes first and second magnetic elements having a beam path region therebetween. One or more magnetic flux compression elements are disposed proximate to the beam path region and between the first and second magnetic elements. During operation, the first and magnetic elements cooperatively generate an oscillatory time-varying magnetic field in the beam path region to scan an ion beam back and forth in time. The one or more magnetic flux compression elements compress the magnetic flux provided by the first and second magnetic elements, thereby reducing the amount of power required to magnetically scan the beam back and forth (relative to previous implementations). Other scanners, systems, and methods are also disclosed.

22 Claims, 5 Drawing Sheets

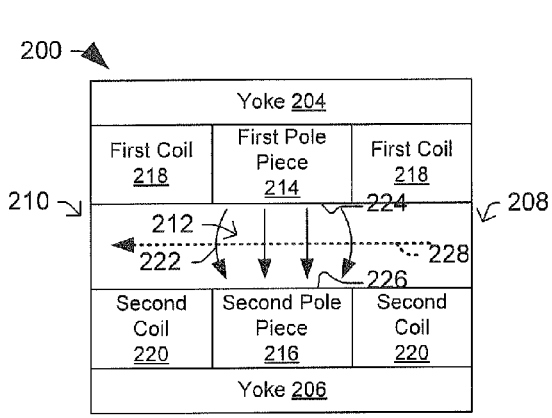
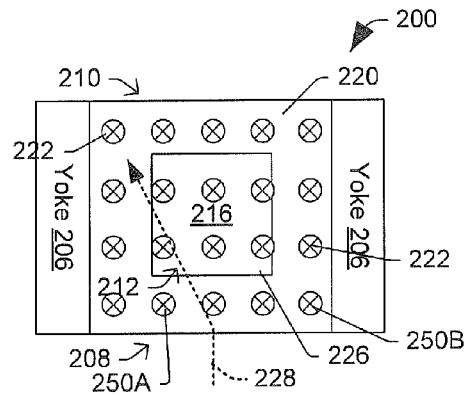
FIG. 2E  FIG. 2F
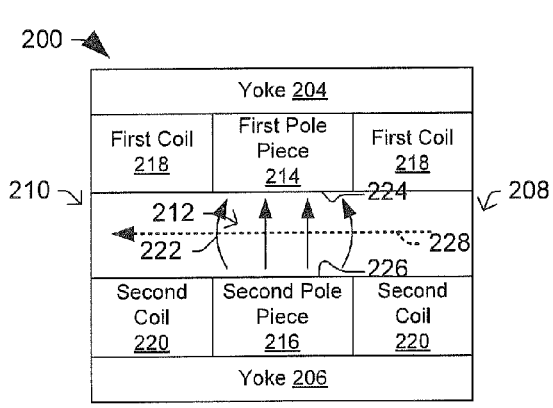
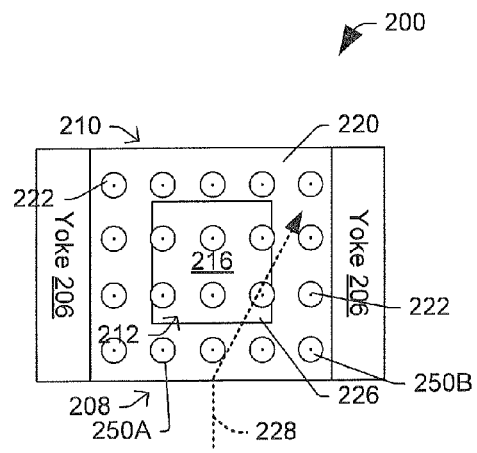
FIG. 2G  FIG. 2H

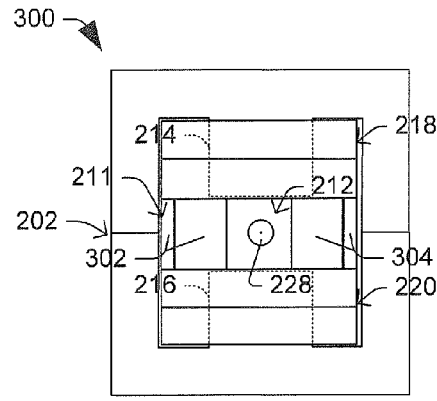
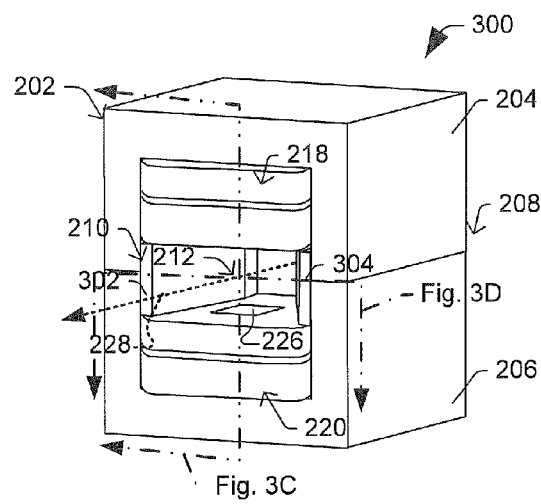
FIG. 3A    FIG. 3B
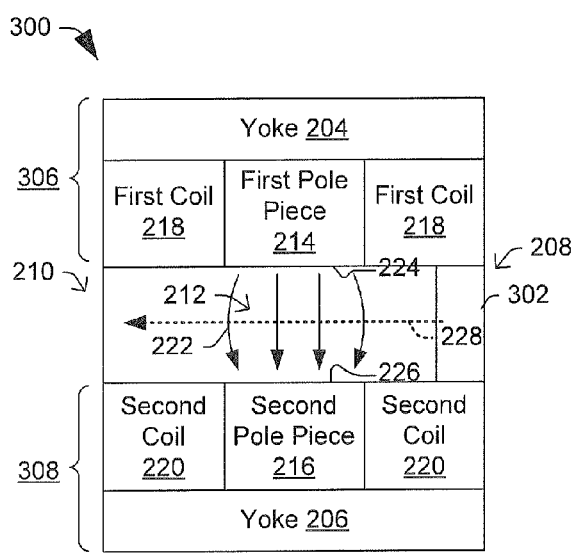
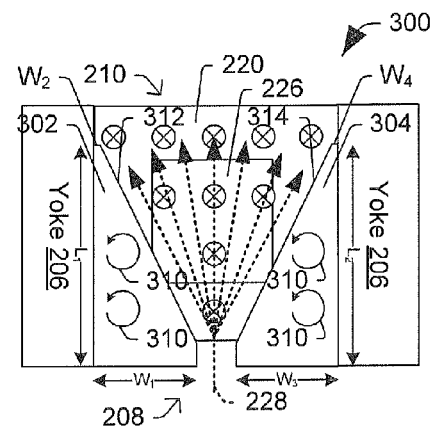
FIG. 3C    FIG. 3D

MAGNETIC SCANNING SYSTEM WITH IMPROVED EFFICIENCY

BACKGROUND

In ion implantation systems, an ion beam is directed towards a work piece (e.g., a semiconductor wafer, or a display panel), and implants ions into a lattice thereof. Once embedded into the lattice of the workpiece, the implanted ions change the physical and/or chemical properties of the workpiece. Because of this, ion implantation is used in semiconductor device fabrication, in metal finishing, and for various applications in materials science research.

The ion implantation application space is historically divided into low dose (medium current), high energy and high dose (high current) applications.

In high current applications the cross-sectional area of a high current ion beam can vary depending on the extent of self-neutralization occurring in the beam, among other factors. In self-neutralization, which occurs in absence of an electric field, the ion beam can attract free electrons near the beam path. This tends to limit beam "blow-up", thereby helping to limit the cross-sectional area of the beam to keep the beam "tight".

In most instances, the cross-sectional area of the beam is less than that of the workpiece and it is helpful to scan the beam over the workpiece to adequately implant the workpiece. Generally, either an electric or magnetic scanner is used in this regard.

One drawback to electric scanners is that, by their very nature they generate an electric field, and thus they attract electrons to positive electrodes or repel them far from negative electrodes. Since the electrodes are typically close to the beam path this tends to remove free electrons from near the beam path. This can cause beam blow up, sometimes resulting in an unmanageably large beam envelope. This large beam envelope can ultimately result in beam current loss.

To limit or avoid beam blow-up and permit partial self-neutralization of the ion beam, magnetic scanners can be used to scan the beam since magnetic scanners do not use biased electrodes. Magnetic scanners generate a time varying magnetic field through which the ion beam passes. The time varying magnetic field diverts or alters the path of the ion beam back and forth in time.

Although a magnetic scanner does not suffer from the space-charge blow-up like an electric scanner, magnetic scanners tend to require high powers to operate. Generally speaking, the higher the operating power, the more expensive the power source and the greater care exercised with respect thereto. Therefore, aspects of the present disclosure relates to techniques for reducing the power needed for magnetic scanners.

SUMMARY

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

Aspects of the present invention facilitate ion implantation by using a magnetic beam scanner that includes first and second magnetic elements having a beam path region therebetween. At least one magnetic flux compression element is disposed proximate to the beam path region and disposed between the first and second magnetic elements.

During operation, the first and second magnetic elements cooperatively generate an oscillatory time-varying magnetic field in the beam path region to scan an ion beam back and forth in time. The one or more magnetic flux compression elements compress the magnetic flux associated with the magnetic field in the beam region, thereby reducing the amount of power required to magnetically scan the beam back and forth, relative to previous implementations.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIGS. 2E-2F show a cross-sectional side and top view, respectively, of the yoke assembly of FIG. 2B illustrating a scanned ion beam at one time.

FIGS. 2G-2H show a cross-sectional side and top view, respectively, of the yoke assembly of FIG. 2B illustrating a scanned ion beam at another time.

FIG. 3A is an end view of a yoke assembly of a magnetic scanner that includes first and second magnetic flux compression elements in accordance with one embodiment.

FIG. 3B is a perspective view of a magnetic scanner that includes first and second magnetic flux compression elements in accordance with one embodiment consistent with FIG. 3A.

FIG. 3C is a cross-sectional side view of the magnetic scanner of FIG. 3B.

FIG. 3D is a cross-sectional top view of the magnetic scanner of FIG. 3B.

DETAILED DESCRIPTION

Figure 1:
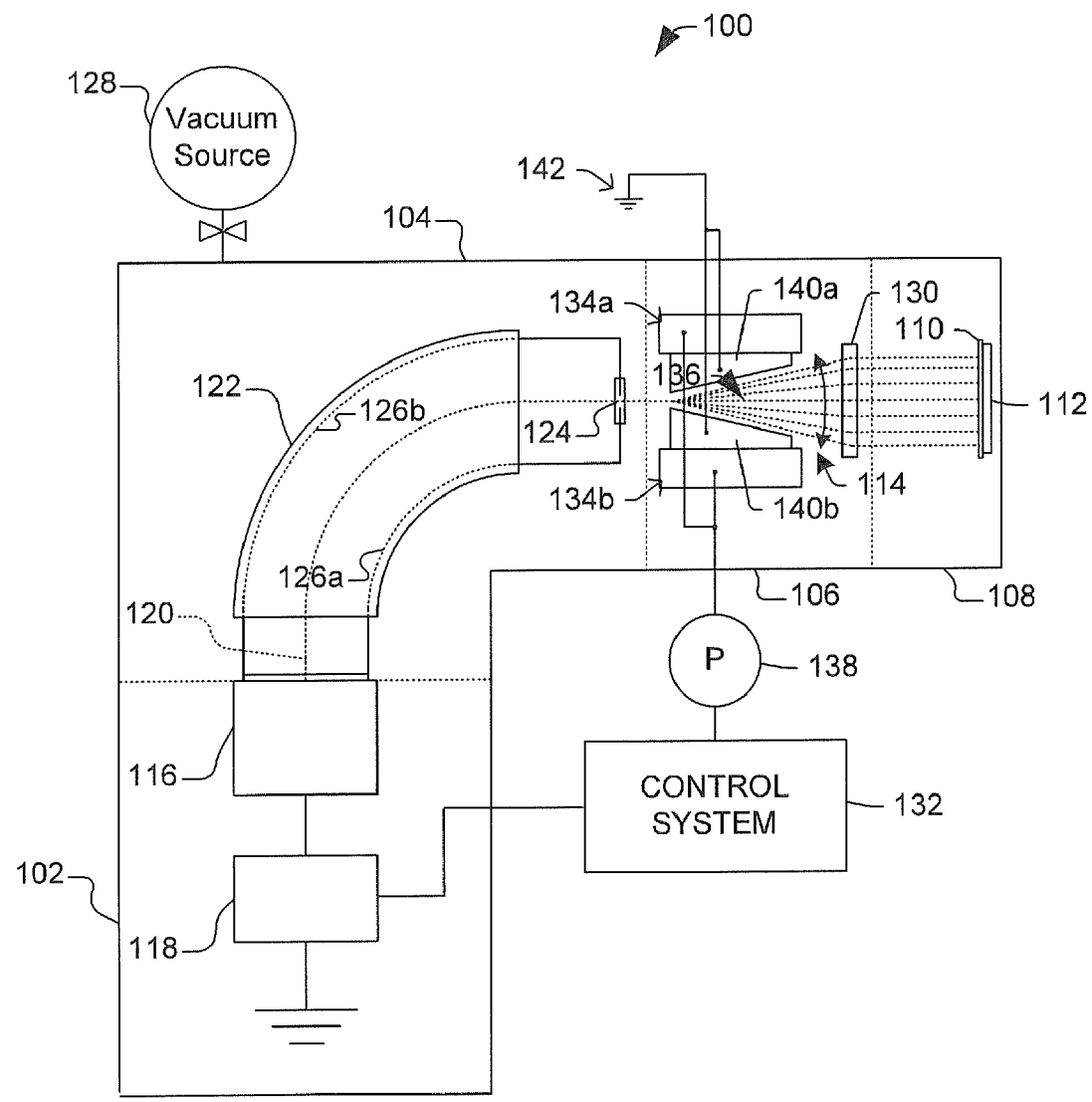
FIG. 1 illustrates an exemplary ion implantation system in accordance with an aspect of the present invention.

The present invention will now be described with reference to the drawings wherein like reference numerals are used to refer to like elements throughout, and wherein the illustrated structures are not necessarily drawn to scale.

FIG. 1 illustrates an ion implantation system 100 having a source terminal 102, beamline assembly 104, magnetic scan system 106, and end station 108, which are collectively arranged so as to inject ions (dopants) into the lattice of a workpiece 110 according to a desired dosing profile. In particular, FIG. 1 illustrates a hybrid-scan ion implantation system 100, wherein a moveable stage 112 is operable to translate the workpiece 110 along a first axis (e.g., into the plane of the page in FIG. 1) while the magnetic scan system 106 provides a scanned ion beam 114 along a second axis perpendicular to the first axis. By scanning the ion beam with respect to the workpiece in this manner, the entire surface of the workpiece can be implanted until a desired doping profile is met.

More particularly, during operation, an ion source 116 in the source terminal 102 is coupled to a high voltage power supply 118 to ionize dopant molecules (e.g., dopant gas molecules), thereby forming a pencil ion beam 120.

To steer the pencil beam 120 from the source terminal 102 towards the workpiece 110, the beamline assembly 104 has a mass analyzer 122 in which a dipole magnetic field is established to pass only ions of appropriate charge-to-mass ratio through a resolving aperture 124. Ions having an inappropriate charge-to-mass ratio collide with the sidewalls 126a, 126b; thereby leaving only the ions having the appropriate charge-to-mass ratio to pass though the resolving aperture 124 and into the workpiece 110. The beam line assembly 104 may also include various beam forming and shaping structures extending between the ion source 116 and the end station 108, which maintain the pencil beam 120 in an elongated interior cavity or passageway through which the pencil beam 120 is transported to the workpiece 110. A vacuum pumping system 128 typically keeps the ion beam transport passageway at vacuum to reduce the probability of ions being deflected from the beam path through collisions with air molecules.

Upon receiving the pencil beam 120, the magnetic scan system 106 laterally diverts or "scans" the pencil beam back and forth in time (e.g., in a horizontal direction) to provide the scanned ion beam 114. In some contexts, this type of scanned pencil beam may be referred to as a ribbon beam. A parallelizer 130 in the magnetic scan system can redirect the scanned ion beam 114 so that ions strike a surface of the workpiece 110 at the same angle of incidence over the entire surface of the workpiece.

A control system 132 can control the relative motions imparted to the scanned ion beam 114 (e.g., via the magnetic scan system 106) and workpiece 110 (e.g., via the moveable stage 112) to achieve a desired doping profile on the workpiece 110. For example, the control system 132 is configured to control one or more variable power sources 138 to deliver time-varying current or voltage to first and second magnetic elements 134a, 134b, each of which can include a coil wrapped around a pole piece. This time-varying current or voltage induces an oscillatory time-varying magnetic field in the beam path region, thereby scanning the ion beam in time. Although the power sources 118 and 138 are shown as separate elements in FIG. 1, these power sources 118, 138 could reside in a single power generator in some embodiments.

As will be appreciated in more detail further herein, in accordance with some aspects of the invention, the magnetic scan system 106 can include one or more magnetic flux compression elements (e.g., 140a, 140b) to improve scanning efficiency in some respects. Often, the magnetic flux compression element(s) are coupled to a fixed voltage 142 (e.g., ground) to limit or prevent beam blowup by stripping the ion beam of its neutralizing electrons, as described supra.

Figure 2A:
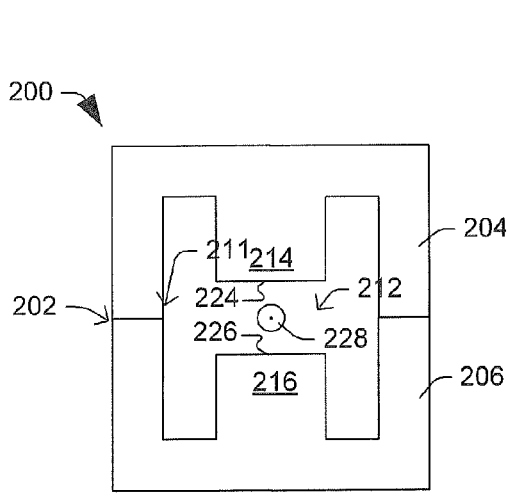
FIG. 2A is an end view of a yoke assembly of a magnetic scanner that does not employ flux compression elements.

To clarify one manner in which efficiency can be improved during magnetic scanning reference is now made to the magnetic scanner 200 illustrated in FIGS. 2A-2D, which suffers from some shortcomings. As shown in FIG. 2A (end view of magnetic scanner 200 without coils in place), the magnetic scanner 200 includes a yoke assembly 202 made up of a first yoke 204 and a second yoke 206. A beam path region 212 passes between the first and second yokes 204, 206 and is generally radially bound by an inner surface 211 of the yoke assembly. The first and second yokes 204, 206 comprise first and second ferromagnetic pole pieces 214, 216, respectively extending towards the beam path region 212.

Figure 2B:
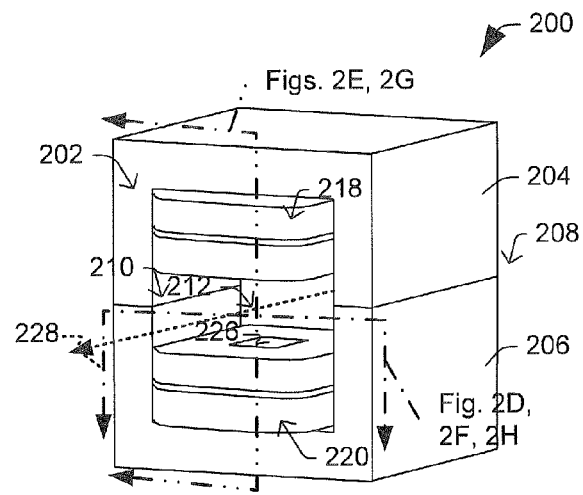
FIG. 2B is a perspective view of the yoke assembly of FIG. 2 with coils wrapped thereabout.
Figure 2C:
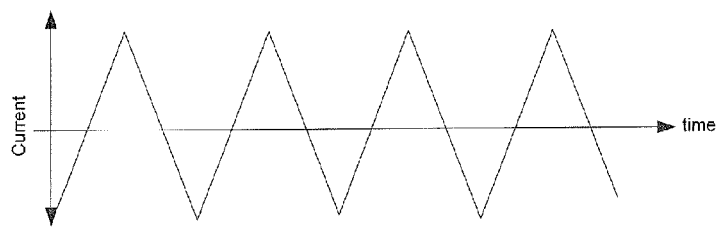
FIG. 2C is a waveform diagram of one example of a time-varying current supplied to coils of the magnetic scanner according to one embodiment.
Figure 2D:
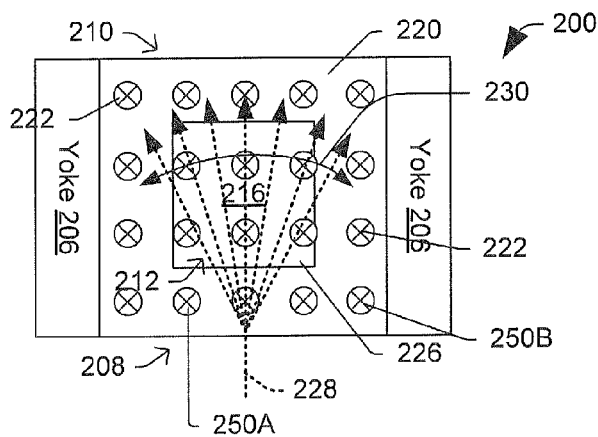
FIG. 2D is a cross-sectional top view of the yoke assembly of FIG. 2B as the ion beam is scanned back and forth in time.

As shown in FIG. 2B (perspective view of magnetic scanner 200 with coils in place), the first and second pole pieces 214, 216 have first and second coils 218, 220, respectively, wrapped thereabout. The first and second coils 218, 220 are coupled to a variable power source (e.g., variable power source 138 in FIG. 1, not shown in FIG. 2). This variable power source provides time-varying currents in the coils such as shown in FIG. 2C, which in turn induces an oscillatory time-varying magnetic field extending from the pole pieces 214, 216 into the beam path region 212. This oscillatory time varying magnetic field scans the ion beam back and forth in time, as shown by arrow 230 in FIG. 2D For example, at a first time as shown in FIGS. 2E-2F, the current can flow through the first and second coils in a clockwise direction. Thus, according to the right hand grip rule (which may also be referred to as the Biot-Savart rule), this current condition results in magnetic field lines 222 from a beam-facing surface 224 of the first pole piece 214 (e.g., acting as a north pole) to a beam-facing surface 226 of the second pole piece 216 (e.g., acting as a south pole) as shown in FIG. 2E. Because the ion beam is made up of charged particles moving through this electric field, the charged particles will be deflected by the magnetic field in accordance with Lorentz's force law, or what sometimes may be referred to as a "right-hand rule" as shown in FIG. 2F FIGS. 2G-2H show the magnetic scanner when the current is flipped to a counter-clockwise direction. Thus, this current condition results in magnetic field lines 222 extending from the beam-facing surface 226 of the second pole piece 216 (e.g., acting as a north pole) to the beam-facing surface 224 of the first pole piece 214 (e.g., acting as a south pole) as shown in FIG. 2G. Under this magnetic field, the charged particles will be deflected in accordance with Lorentz's force law as shown in FIG. 2H.

Although FIG. 2's embodiment is capable of scanning the ion beam 228 back and forth in an oscillating manner, the inventors have appreciated that much of the energy that goes into powering the oscillatory magnetic field is "wasted" in some regards. For example, although the oscillatory magnetic field is powered across regions not impinged by the beam (e.g., in regions 250A, 250B in FIG. 2D), the ion beam does not directly interact with the magnetic field lines in these regions.

Therefore, the inventors have devised improved magnetic beam scanners that make use of magnetic flux compression elements that lessen the magnetic energy requirements, relative to previous implementations.

FIGS. 3A-3D show an example of a magnetic scanner 300 in accordance with some embodiments of the present invention. In addition to the previous components discussed with respect to FIG. 2, the magnetic scanner 300 also includes one or more magnetic flux compression elements as discussed below. For example, in the illustrated embodiment, first and second magnetic flux compression elements (302, 304, respectively) are situated within the inner surface 211 of the yoke assembly that radially bounds the beam path region 212.

During operation, the first and second magnetic flux compression elements 302, 304, which typically comprise non-laminated conductive bodies, are subject to induced eddy currents 310 that are diamagnetic (see FIG. 3D). Thus, these induced currents 310 cancel the magnetic field that would otherwise be generated in the volume now filled by the first and second magnetic flux compression elements 302, 304. In addition, these induced currents 310 add to the magnetic field outside of the first and second flux compression elements 302, 304. In this way, even though the eddy currents 310 cause some power loss, the magnetic flux compression elements reduce the overall magnetized volume in the beam region 212, and correspondingly reduce the power required to generate a given magnetic field in the beam region. Thus, the magnetic flux compression elements tend to make it more economical to manufacture a power supply for the magnetic scanner 300, relative to previous implementations.

In many embodiments, a magnetic flux compression element comprises a metallic material with a high conductivity to help limit power losses as the eddy currents flow therethrough. For example, a magnetic flux compression element can comprise copper or aluminum with gold or silver coatings, or could comprise other highly conductive metals (e.g., platinum). It will be appreciated that any material with high conductivity can be used, but the ones listed are perhaps the most common examples. There can be combinations of these materials in form of layered materials, coated bulk metal or alloys. Cost and weight affect choice of materials, too. For example, although solid gold flux compressors would provide good functionality, they would be extremely expensive to implement.

In the illustrated embodiment, the first and second magnetic flux compression elements 302, 304 comprise first and second conductive bodies, respectively. These conductive bodies are generally wedge-shaped, wherein the wide ends of the wedge-shaped bodies are near the scanner's entrance end 208 and the narrow ends of the wedge-shaped bodies are near the scanner's exit end 210. More precisely, the first conductive body 302 is illustrated as having a first length $L_1$ extending continuously from near the scanner's entrance end 208 to near the scanner's exit end 210. The first conductive body 302 is also illustrated as having a first width $W_1$ near the scanner's entrance end 208 and a second width $w_2$ near the scanner's exit end 210, wherein the first width $w_1$ is greater than the second width $w_2$ to define a tapered surface 312 that accommodates the scanned ion beam 228.

Although the illustrated embodiment of FIG. 3C shows the first length $L_1$ of the first conductive body 302 approximately equal to a second length $L_2$ of the second conductive body 304; the first width $W_1$ of the first conductive body 302 approximately equal to a third width $W_3$ of the second conductive body 304; and the second width $W_2$ of the first conductive body 302 approximately equal to a fourth width $W_4$ of the second conductive body 304; in other embodiments these lengths and widths could be different.

In many embodiments, the first and second conductive bodies 302, 304 are substantially continuous solid bodies without a cavity therein. This helps limit the amount of power required to generate a given magnetic field. However, a solid continuous body is not required. Typically, the greater the volume of the conductive material included in the flux compression elements, the greater the power savings provided by the flux compression elements. With this said, it is noteworthy that the flux compression elements or any of its parts should not present a closed electrical loop around the beam path region 212; if the flux compression element or any of its parts were made such that the induced eddy currents in the flux compression element would reduce or remove the magnetic field in the beam path the flux compression element would be detrimental to the intended scanning.

Figure 4:
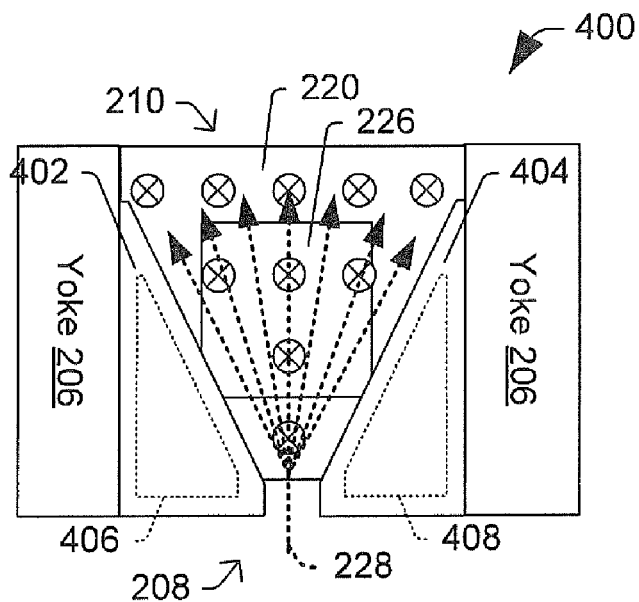
FIG. 4 is a cross-sectional top view of another magnetic scanner which includes hollow magnetic flux compression elements.

In other embodiments, however, such as shown in FIG. 4 for example, first and second magnetic flux compression elements 402, 404 each have an outer shell with one or more voids 406, 408 therein (e.g., forming a hollow structure). In such embodiments, the outer shell has a wall-thickness that is greater than or equal to a skin-depth associated with the conductive material of the magnetic flux compression element at a given frequency. As is well known in the art, the skin depth is a material property defined as the depth to which an electromagnetic wave will penetrate the material until its amplitude is reduced to 1/e (e is the base of the natural logarithm=2.718...) of the amplitude at the surface. The skin depth is expressed as a function of the material's conductivity σ, magnetic permeability μ and the frequency f of the electromagnetic wave by the following equation:

$$d = \frac{1}{\sqrt{\pi \mu f \sigma}}$$

For beam scan frequencies of the range of 1-100 Hz the skin depth of copper, for example, is approximately in a range from several centimeters to several millimeters. Such "hollow" magnetic flux compressors may be advantageous in that they reduce the amount of material needed, relative to solid implementations. This correspondingly limits cost and weight of the magnetic flux compressors, which improves production and installation in some regards.

Figure 5:
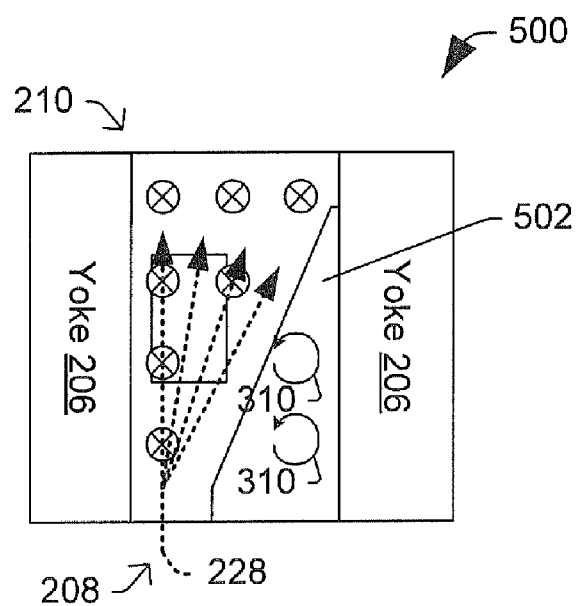
FIG. 5 is a cross-sectional top view of a unipolar scanner that includes one magnetic flux compressor.

It will be appreciated that the precise number of magnetic flux compression elements and their respective geometries can vary widely depending on the particular implementation. For example, although FIG. 3 shows only two flux compression elements (302, 304) that are symmetrically disposed about the scan path 228, other implementations could include only a single flux compression element or could include a great number of flux compression elements. FIG. 5 shows one such example of a unipolar scanning system 500 wherein the beam is scanned in only a single direction from the beam path 228. In this example, only a single magnetic flux compression element 502 is included within the yoke assembly. Like previously discussed magnetic flux compression elements, the magnetic flux compression element 502 can be solid or hollow, is often coupled to ground, and can have a variety of shapes and compositions.

Typically, the larger the volume taken up by the flux compression elements, the greater power savings the flux compression elements can provide. Thus, to provide the maximum power savings, the flux compression elements can generally fill a volume between the beam path region and the inner surface of the yolk assembly. However, it is also possible to use smaller flux compression elements, even though they will tend to provide smaller power savings.

It may be appreciated that even though the flux compressors reduce the overall power requirement of the scanning system some fraction of the power delievered by the system is dissipated within the flux compressors, e.g., the induced eddy currents cause resistive losses inside the flux compressors To keep the flux compressors at a controlled operating temperature, especially if the flux compressors reside in vacuo where air cooling is not available, it may be advantageous to actively cool flux compressors using techniques known in the art. In one embodiment the cooling can be brought about by flowing coolant through channels drilled into the flux compressors. In another embodiment cooling tubes may be attached to the flux compressor assembly such that the heat generated in the flux compressors is removed via the coolant flowing through the tubes.

Although the invention has been illustrated and described with respect to one or more implementations, alterations and/or modifications may be made to the illustrated examples without departing from the spirit and scope of the appended claims. For example, different types of end stations 108 may be employed in the ion implantation system 100. In some embodiments, a "batch" type end station can simultaneously support multiple workpieces on a rotating support structure, wherein the workpieces 110 are rotated through the path of the ion beam until all the workpieces 110 are completely implanted. A "serial" type end station, on the other hand, can be used in other embodiments. Serial type end stations support a single workpiece along the beam path for implantation, wherein multiple workpieces are implanted one at a time in serial fashion, with each workpiece 110 being completely implanted before implantation of the next workpiece 110 begins. Further, although FIG. 1 illustrated a hybrid system where the workpiece 110 was mechanically translated in a first (Y or slow scan) direction while the beam is scanned in a second (X or fast scan) direction to impart the scanned ion beam 114 over the entire workpiece 110; other systems could include magnetically scan the ion beam along two different axes rather than using mechanical translation.

In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. A magnetic deflection system for scanning an ion beam comprising:
    a yoke assembly having an entrance end and an exit end with a beam path region extending therebetween, wherein the beam path region is generally radially bounded by an inner surface of the yoke assembly;
    first and second pole pieces extending from the yoke assembly towards one another and towards the beam path region, wherein a pole gap region is defined between the first and second pole pieces proximate to the beam path region;
    first and second coils wrapped around the first and second pole pieces, respectively, wherein the first and second coils are configured to be coupled to a current source to pass a time-varying current through the first and second coils such that the first and second coils generate an oscillatory time-varying magnetic field in the pole gap region; and
    at least one magnetic flux compression element disposed within the inner perimeter of the yoke assembly and outside of the beam path region.

2. The magnetic deflection system of claim 1, wherein the at least one magnetic flux compression element is coupled to a fixed voltage.

3. The magnetic deflection system of claim 1, wherein the first and second coils are bedstead shaped.

4. The magnetic deflection system of claim 1, wherein the at least one magnetic flux compression element comprises at least one of: aluminum, copper, silver, gold, platinum, or a combination thereof.

5. The magnetic deflection system of claim 1, wherein the magnetic flux compression element is actively cooled.

6. The magnetic deflection system of claim 1, wherein the at least one magnetic flux compression element comprises:
    a first conductive body disposed about a first side of the beam path region, and
    a second conductive body disposed about a second side of the beam path region, wherein the second side is opposite the first side with respect to the beam path region.

7. The magnetic deflection system of claim 6, where the first and second conductive bodies do not cooperatively form a continuous electrical loop around the beam path region.

8. The magnetic deflection system of claim 6, wherein the first and second conductive bodies are each generally wedge-shaped, wherein wide ends of the first and second conductive bodies are proximate to the entrance end of the yoke assembly and wherein narrow ends of the first and second conductive bodies are proximate to the exit end of the yoke assembly.

9. The magnetic deflection system of claim 6, wherein the first and second conductive bodies are substantially solid volumetric bodies.

10. The magnetic deflection system of claim 6, wherein the first and second conductive bodies each comprise an outer-shell that defines one or more voids within the respective conductive bodies.

11. The magnetic deflection system of claim 6, wherein the first and second conductive bodies are coupled to a fixed voltage.

12. An ion implantation system comprising:
    an ion source that generates an ion beam along a beam path;
    a mass analysis component downstream of the ion source that performs mass analysis on the ion beam;
    a magnetic deflection system either upstream or downstream of the mass analysis component, wherein the magnetic deflection system comprises:
        a yoke assembly having an entrance end and an exit end through which the beam path extends, wherein the beam path in the yoke assembly is generally bounded by an inner surface of the yoke assembly;
        first and second pole pieces extending from the yoke assembly towards the beam path in the yoke assembly;
        first and second coils wrapped around the first and second pole pieces, respectively, wherein the first and second coils are coupled to a current source configured to pass a time-varying current through the first and second coils such that the first and second coils generate an oscillatory time-varying magnetic field in the beam path in the yoke assembly; and
        at least one magnetic flux compression element disposed within the inner perimeter of the yoke assembly and outside the beam path region.

13. The ion implantation system of claim 12, further comprising:
    a parallelizer downstream of the magnetic scanner that redirects a scanned ion beam parallel to a common axis, thereby providing a parallelized ion beam; and
    an end station positioned downstream of the parallelizer that receives the parallelized ion beam.

14. The ion implantation system of claim 12, wherein the at least one flux compression element is coupled to a fixed voltage.

15. The ion implantation system of claim 12 wherein the at least one flux compression element is actively cooled.

16. The ion implantation system of claim 12, wherein the at least one flux compression element comprises:
a first conductive body disposed about a first side of the ion beam path, and
a second conductive body disposed about a second side of the ion beam path region, wherein the second side is opposite the first side with respect to the ion beam path.

17. The ion implantation system of claim 16, where the first conductive body and the second conductive body do not form a continuous electrical loop around the beam path.

18. The ion implantation system of claim 16, wherein first and second conductive bodies comprises at least one of: aluminum, gold, silver, platinum, copper, combinations thereof in the form of alloys or coated bulk metals.

19. The ion implantation system of claim 12, wherein the at least one magnetic flux compression element is a substantially solid conductive body.

20. The ion implantation system of claim 12, wherein the at least one magnetic flux compression element comprises an outer-shell that defines one or more voids within the at least one magnetic flux compression element.

21. A magnetic scanner comprising:
first and second pole pieces for cooperatively guiding an oscillatory time-varying flux to a beam path region;
flux compression means proximate to the beam path region and for compressing magnetic flux provided by the first and second pole pieces.

22. The ion implantation system of claim 21, wherein the flux compression means comprises at least one of: aluminum, copper, silver, gold, platinum, or combinations thereof in the form of alloys or coated bulk metals.

* * * * *